United States Patent
Chang

(10) Patent No.: US 7,068,692 B2
(45) Date of Patent: Jun. 27, 2006

(54) LASER DRIVER CIRCUIT FOR BURST MODE TRANSMISSION AND MANUFACTURING METHOD

(75) Inventor: Yi-Yang Chang, Taichung (TW)

(73) Assignee: Asia Optical Co., Inc., Taichung (TW)

( * ) Notice: Subject to any disclaimer, the term of this patent is extended or adjusted under 35 U.S.C. 154(b) by 311 days.

(21) Appl. No.: 10/802,325

(22) Filed: Mar. 17, 2004

(65) Prior Publication Data

US 2005/0152413 A1    Jul. 14, 2005

(30) Foreign Application Priority Data

Jan. 14, 2004    (TW) .............................. 93100939 A

(51) Int. Cl.
*H01S 3/00*    (2006.01)
(52) U.S. Cl. .............................. 372/38.02; 372/29.01; 372/34
(58) Field of Classification Search ............. 372/29.01, 372/30, 34, 38.02
See application file for complete search history.

(56) References Cited

U.S. PATENT DOCUMENTS 5,548,435 A * 8/1996 Tahara et al. ............... 398/195
5,914,622 A * 6/1999 Inoue ......................... 327/172
6,593,864 B1 * 7/2003 Reilly ......................... 341/119
2002/0071163 A1 * 6/2002 Tokita et al. ............... 359/187
2002/0118424 A1 * 8/2002 Miki et al. .................. 359/187
2005/0152416 A1 * 7/2005 Chang ..................... 372/38.02
2005/0213474 A1 * 9/2005 Liu ............................. 369/116

\* cited by examiner

*Primary Examiner*—Minsun Oh Harvey
*Assistant Examiner*—Delma R. Flores Ruiz
(74) *Attorney, Agent, or Firm*—Thomas, Kayden, Horstemeyer & Risley

(57) ABSTRACT

A method for making a laser driver circuit for burst mode is described. A continuous mode laser driver circuit can be used in burst mode transmission system by using the method. The method is described as follows. First, a continuous mode laser driver chip is selected, the chip has a temperature compensation output and a pulse width adjustment input. Next, the temperature compensation signal from the temperature compensation output is converted to a pulse width adjustment signal using an eye diagram adjustment circuit, and the pulse width adjustment signal is sent to the pulse width adjustment input. The pulse width adjustment signal automatically adjusts the cross points of the eye diagram of the laser according to the environmental temperature, so that the cross points are sustained at a predetermined level to reduce the Bit Error Rate.

20 Claims, 6 Drawing Sheets

LASER DRIVER CIRCUIT FOR BURST MODE TRANSMISSION AND MANUFACTURING METHOD

BACKGROUND

1. Field of Invention

The present invention relates to a design and manufacturing method for a laser driver circuit. More particularly, the present invention relates to a design and manufacturing method for utilizing a continuous mode laser driver circuit for burst mode application. The method maintains the level of a transmission signal in a suitable position, so that the cross points of the eye diagram of the laser emitting apparatus are maintained at a predetermined level and the bit error rate is decreased.

2. Description of Related Art

In the past, the signal of optical fiber communication is usually transmitted in continuous mode. In continuous mode, no signal is interrupted during the transmission process, the structure of optical fiber communication can only be established as the structure where one receiver connects to one transmitter. The structure is also called a P2P (Point to Point) structure.

However, if FTTX (Fiber To The X, X representing a home, building, curb, . . . etc) is used, since the signal don't need to be transmitted at all the time, thus it will be a waste for the bandwidth of communication and the fiber if using a communication apparatus of continuous mode.

Because of the problems described above, the designer of an optical fiber communication system develops a FSAN (Full Service Access Network) structure for FTTX application. In FSAN, an important concept is P2MP (Point To Multi Points); When a user wants to transmit some information, the user is allowed to transmit the information immediately; After the completion of transmitting the information, the user is allowed to turn the laser off to avoid signal conflicts. Such transmission is so called burst mode, which is different from the continuous mode mentioned above.

For an optical fiber communication system used for burst mode application, a main role is the laser driver chip. For burst mode laser driving, the laser driver circuit must take very short time to turn on and drive a communication laser diode to transmit signal and then turn off the laser diode completely and rapidly when there is no signal input.

In the FSAN standard, there is no clear definition for the signal present time and stop time in burst mode. Therefore, the system integration companies have developed many different solutions. Some of the solutions need a strict timing control. Thus, the laser driver chip is hard to be available and the production cost is increased.

In burst mode optical fiber communication system, when the NZR (Non Return to Zero) data rate is lower than 1.5 G bps, a direct modulation of laser driver can be used. When the NRZ data rate is higher than 1.5 bps, an external modulator is needed. This invention is used in the burst mode optical fiber communication of which the NRZ data rate is lower than 1.5 G.

In direct modulation, a bias current and a modulation current is needed fora laser diode. Usually, a laser driver chip is used to provide the bias current and the modulation current. The laser driver circuit receives the input voltage signal and then converts the input voltage signal into a current strength.

In continuous mode, the laser driver circuit usually has an APC (Average Power Control) function which cooperates with a PD (Photo Detector), so that the average optical output power and cross points of the optical eye diagram are maintained at an optimal level. At present, there are many ICs with the APC or APD function for continuous mode application in market. But only a few specially designed integrated circuits are available for burst mode application. To obtain the best level of optical output power and cross points of the optical eye diagram for burst mode application, these specially designed integrated circuits usually have DAPC (Digital Automatic Power Control) functions which cooperates with a PD (Photo Detector) or external bias capacitors that can be used for bias current switching. The external bias capacitors are used to control the bias current stability of the laser diodes. However, the two integrated circuits mentioned above have the disadvantages of high manufacturing cost and long bias setting time.

SUMMARY

It is therefore an objective of the present invention to provide a design and manufacturing method for a laser driver circuit. The pulse width is automatically adjusted by the temperature compensation signal according to the environmental temperature, so that the laser power's cross points of the optical eye diagram are adjusted automatically. Thus the laser emitting apparatus driven by the laser driver chip doesn't need bias current setting time.

It is another an objective of the present invention to provide a design and manufacturing method for a laser driver circuit. The invention decreases the manufacturing cost of the laser driver chip and is helpful for the design of the burst mode optical fiber communication system.

The laser driver circuit is used to provide a driver current to a laser diode to emit a laser light. The invention utilizes a continuous mode laser driver integrated circuit for a burst mode communication application. The laser driver integrated circuit can generate a temperature compensation signal according to the environmental temperature, then the temperature compensation signal is converted to a pulse width adjustment signal through a pulse width adjustment circuit. Then the pulse width adjustment signal is sent to the pulse width adjustment input of the laser driver circuit and is used to adjust the pulse width of the laser optical output. The pulse width adjustment circuit can be a resistor combination. Base on the relationship between the voltage range of the temperature compensation signal and the acceptable voltage range of the pulse width adjustment input, repeatedly select a suitable resistor combination to act as the pulse width adjustment circuit. The pulse width variation will result in the shift of cross point of the optical eye diagram. So the cross points of the optical eye diagram can be adjusted by adjusting the pulse width, then the cross points are able to be maintained at a predetermined level. In a normal situation, when the temperature rises, the laser output power decreases; Meanwhile, if the polarity of the temperature compensation signal is the same as the polarity of the environmental temperature, the temperature compensation signal has a higher voltage for higher temperature and if the polarity of the temperature compensation signal is opposite to the environmental temperature, the temperature compensation signal has a lower voltage for higher temperature. The temperature compensation signal is fed to the pulse width adjustment input in order to keep the cross points of optical eye diagram be in normal figure for variation of environment temperature. Therefore, a laser driver integrated circuit of positive polarity or negative polarity is selected according to actual needs.

The laser driver circuit mentioned above, the integrated circuit, is originally designed for a continuous mode application. When an external modification is added to the laser driver circuit, the laser driver circuit can be used for a burst mode application. In order to meet the requirement of the high switching speed of a burst mode application, the workable frequency of the laser driver circuit selected must be higher than 2.5 G Hz even if the laser driver circuit is working under the frequency of 1.5 G Hz for a burst mode application. Meanwhile, the laser driver circuit must be working in open loop mode. The average power control (APC) function of the laser driver circuit cannot be used in the invention. Therefore, the invention doesn't need the average power control function.

The method of avoiding the situation where the laser output power increases or decreases out of range because of the variation in temperature is described as follows. When the temperature is in a range of 0 to 70 degrees Celsius, the required output of laser power for bust mode application is usually located in a range of −1.5 dBm to +3.5 dBm. And the maximum value of the variation due to temperature change for the average laser output power is about 3 dBm. Therefore, a first bias circuit is used to achieve the object of the laser output power requirement mentioned above. The first bias circuit is a resistor combination. One side of the resistor combination is connected to the modulation current setting input while the other side is connected to ground. The modulation current is able to be adjusted by the resistor combination, so that the logic "1" level of the optical eye diagram is also adjusted. Then, the laser output power of the laser emitting apparatus is adjusted between 1.5 and 3.0 dBm at room temperature (25 degrees Celsius). Therefore, even if the laser output power decreases because of the rise, about 3 dBm, in temperature, the minimum laser power is maintained at −1.5 dBm (1.5 dBm–3 dBm), and meets the requirement of the system.

When the laser driving current is turned to off state, the laser output power must be maintained at a level lower than −43 dBm for burst mode application. And the maximum variation of this value is also about 3 dBm. So, a second bias circuit is applied for achieving the requirement of the laser output power. The second bias circuit is also a resistor combination. The resistor combination is connected to the bias current setting input at one terminal and grounded at the other terminal. The bias current is able to be adjusted by the resistor combination, so the logic "0" level of the optical eye diagram is adjusted. The laser power is supposed to be adjusted to −46 dBm to avoid the situation where the laser output power is higher than −43 dBm because of the variation in temperature.

Further, this invention uses a cheap continuous mode laser driver circuit, such as an integrated circuit, for the laser emitting apparatus and the laser driver circuit can be employed in a burst mode application after adding some external circuit.

Moreover, because a continuous mode laser driver circuit is used in the laser emitting apparatus, when the laser driver circuit is transmitting signals in burst mode, the bias current doesn't need to be turned on; while the laser driver circuit is not transmitting signals, the bias current also doesn't need to be turned off. Therefore, no bias current settling time is needed in the laser emitting apparatus.

It is to be understood that both the foregoing general description and the following detailed description are examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
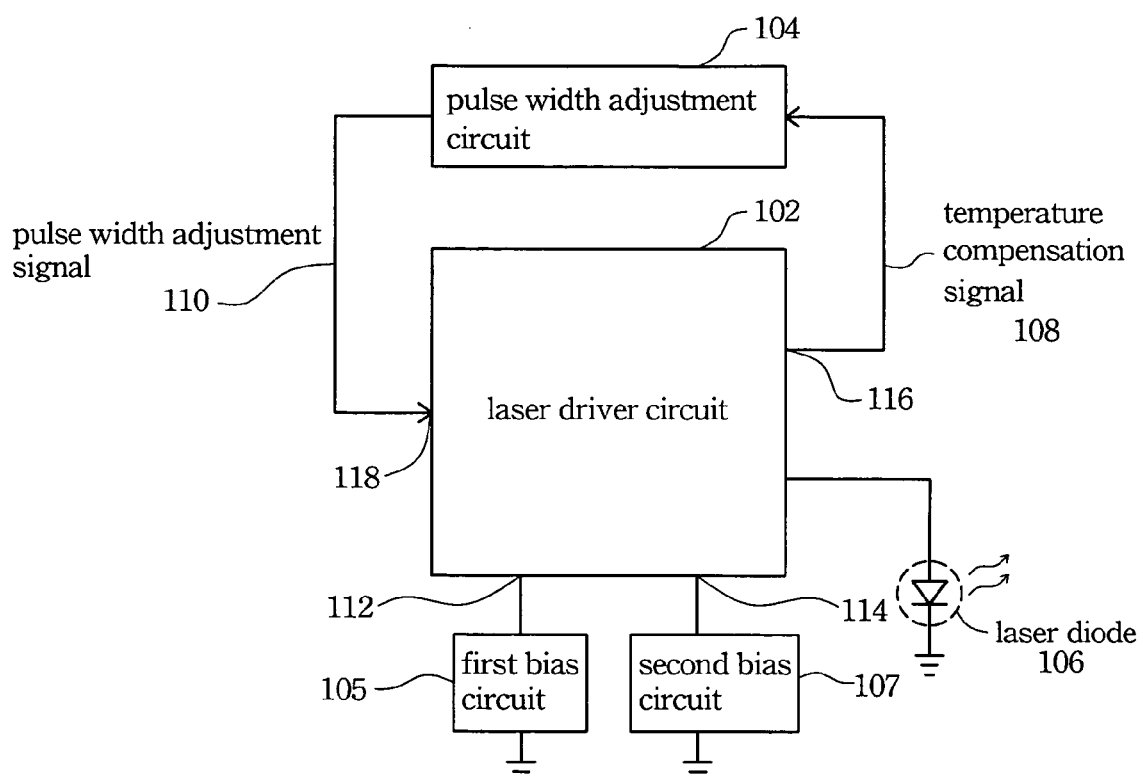
FIG. 1 is a block diagram illustrating the preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 5:
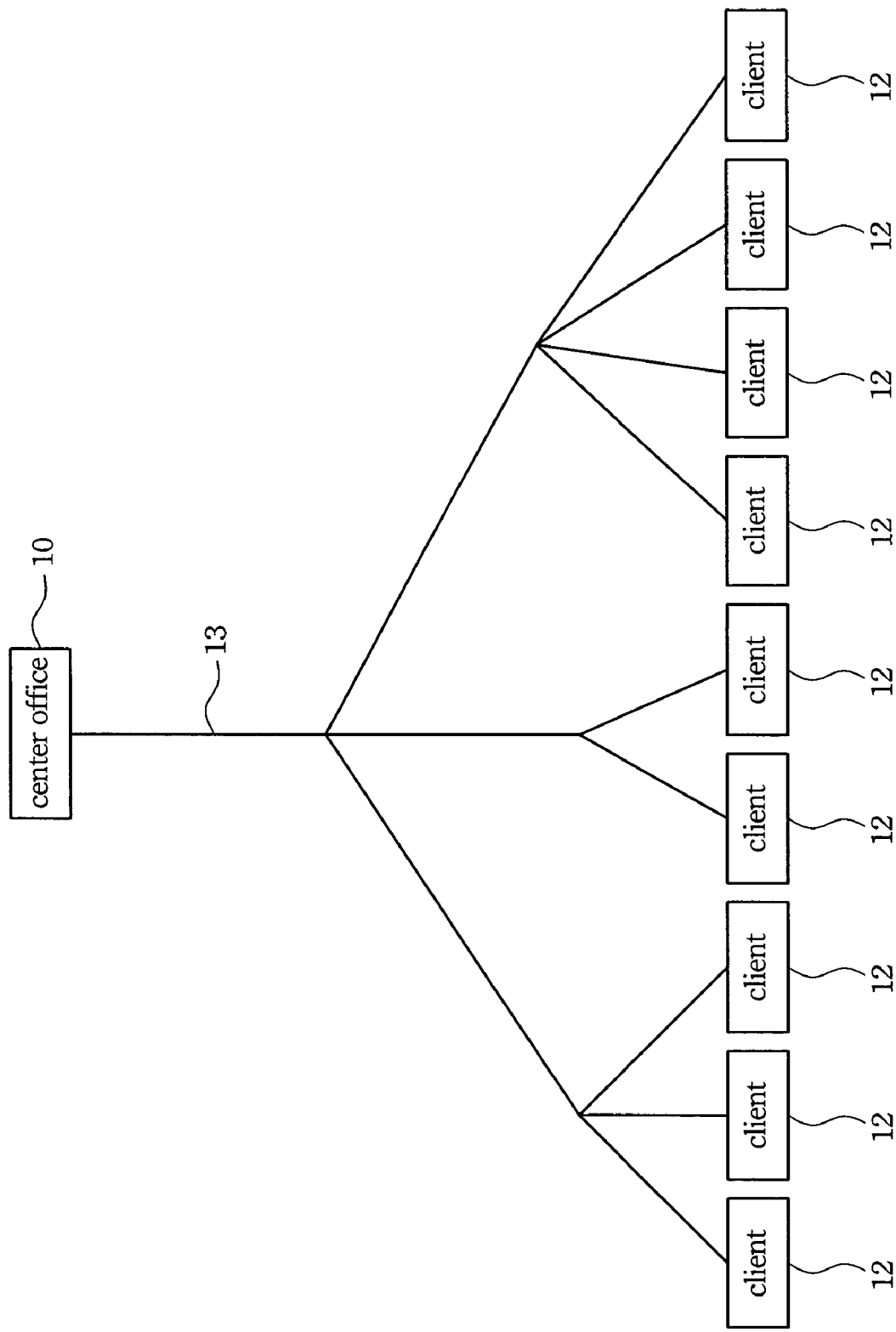
FIG. 5 is a diagram illustrating a P2MP communication system consisted of optical fibers according to the present invention.

FIG. 5 is a diagram illustrating a communication system consisting of optical fibers. With reference to FIG. 5, center office 10 is connected to a plurality of clients 12 via optical fibers 13 to form a FTTX structure. The center office 10 uses one bandwidth section of optical fiber 13 at least to broadcast information and control signals to each client 12. Further, a plurality of clients 12 share the bandwidth of the optical fiber 13 to upload information to the center office 10.

Figure 6:
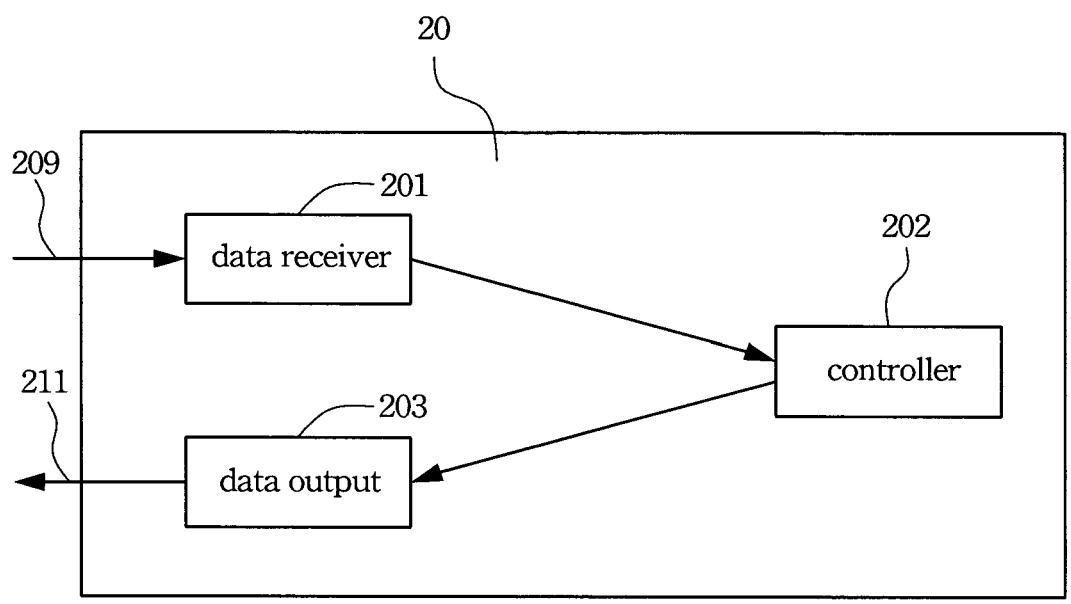
FIG. 6 is a diagram illustrating a fiber optical communication apparatus according to the present invention.

Next, with reference to FIG. 5 and FIG. 6, the optical fiber communication apparatus 20 installed in the client 12 is described as follows. The optical fiber communication apparatus 20 is connected to the center office apparatus of the center office 10 via the fiber 13. The optical fiber communication apparatus 20 has a data receiver 201, a data transmitter 203, and a controller 202. The data receiver 201 receives the input data from the receiving channel 209 of the optical fiber 13. The input data includes the time slot data of each client designated by the center office 10. The time slot data indicates the time slot that the optical fiber communication apparatus 20 is allowed to upload the data to the office center 10.

The controller 202 further controls the data transmitter 203 to output a burst optical signal, the data transmitter 203 uploads the data to the office center 10 via the channel 211 of the optical fiber 13 in burst mode operation. Additionally, the laser driver circuit of the invention is located in the data transmitter 203. The details are described in the following:

FIG. 1 is a block diagram illustrating the preferred embodiment of the invention. With reference to FIG. 1, the laser emitting apparatus 100 includes a laser driver circuit 102, and a pulse width adjustment circuit 104. The laser driver circuit 102 is used to provide a driving current to a laser diode 106 to emit a laser light.

With reference to FIG. 1, a laser driver circuit 102 must be selected first. The laser driver circuit 102 is originally designed for a continuous mode application. When modified by an external circuit, the laser driver circuit 102 can be used for a burst mode application.

In the embodiment, the step of selecting the laser driver circuit 102 has the following requirements: The laser driver circuit 102 must have a pulse width adjustment (PWA) function. The laser driver circuit 102 does not need to have an average power control (APC) function. And the laser driver circuit 102 must have a temperature compensation signal output.

Moreover, the laser driver circuit 102 must be workable in open loop status. The laser driver circuit 102 must have a bias current setting function and a modulation current setting function. The open loop status mentioned above means that the laser driver circuit 102 is workable without the feedback from optical output power. The workable frequency of the continuous mode laser driver circuit 102 needs to be equal or higher than 2.5 G Hz even if the laser driver circuit is working under the frequency of 1.5 G Hz in burst mode.

The pulse width adjustment function means that the laser driver circuit 102 receives a pulse width adjustment signal 110 to adjust the pulse width. The pulse width is the period of the laser output power's eye diagram.

Figure 3A:
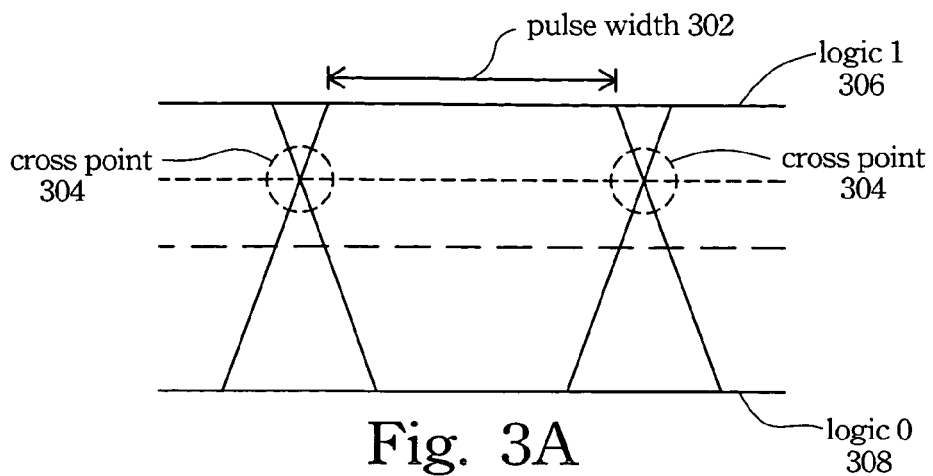
FIG. 3A–FIG. 3C are diagrams illustrating the pulse width adjustment of the optical eye diagram of the laser driver circuit according to the present invention.
Figure 3B:
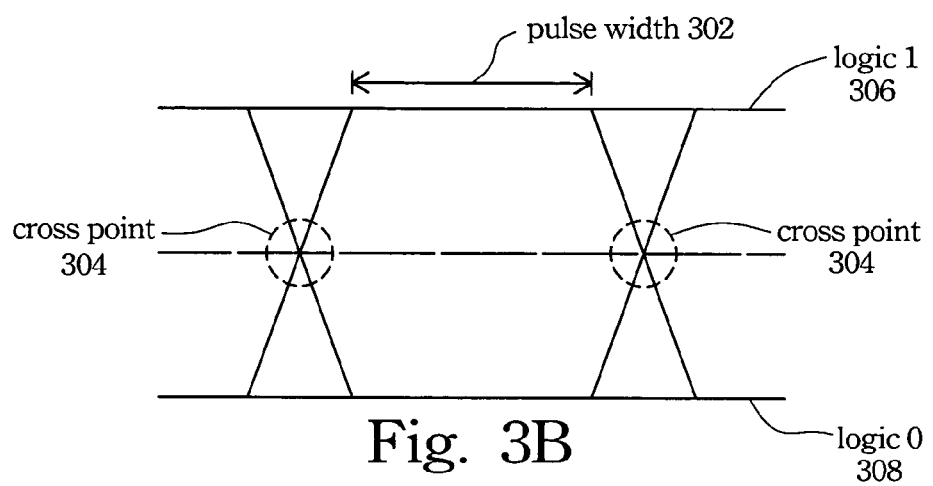
Figure 3C:
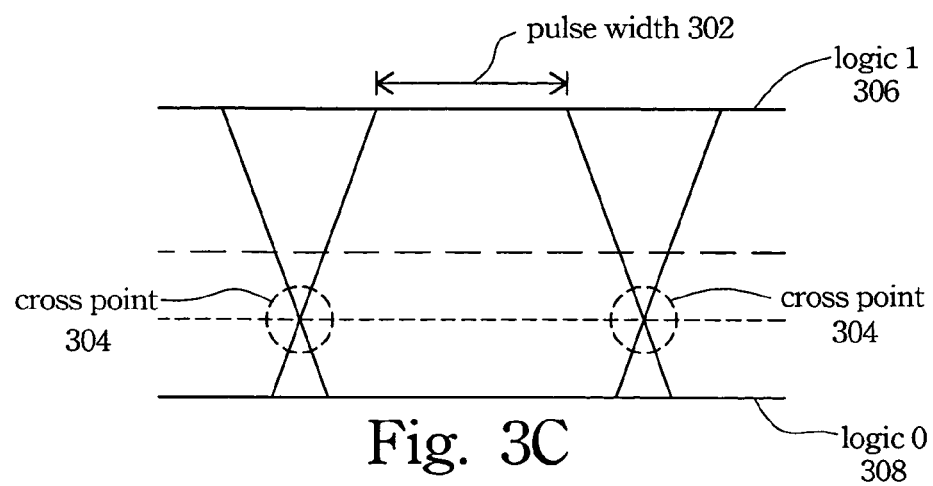

FIG. 3A–FIG. 3C are diagrams illustrating the pulse width adjustment of the laser output power's eye diagram. With reference to FIG. 3A–FIG. 3C, when the logic "1" level 306 and logic "0" level 308 are fixed, the level of the cross point 304 can be adjusted by adjusting the pulse width 302.

In FIG. 3A–FIG. 3C, the period of the pulse width 302 is longest in FIG. 3A and is shortest in FIG. 3C. The levels of the cross point 304, from high to low, are shown in FIG. 3A, FIG. 3B, and FIG. 3C respectively. Therefore, the level of the cross point 304 can be adjusted by adjusting the pulse width 302.

Further, the laser driver circuit 102 must have a temperature compensation signal output function. With reference to FIG. 1, the temperature compensation signal output usually outputs a temperature compensation signal. The temperature indication signal is a voltage signal. The voltage signal is approximately proportional to the temperature.

With reference to FIG. 1, the invention utilizes a laser driver circuit 102 having a temperature compensation signal output 116 and a pulse width adjustment (PWA) function. The temperature compensation signal output 116 of the laser driver circuit 102 generates a temperature compensation signal 108 and then the signal be converted into a pulse width adjustment signal 110 by the pulse width adjustment circuit 104. Then the pulse width adjustment signal is sent to the pulse width adjustment input 118 of the laser driver circuit 102. When temperature rises, the laser power decreases, so that the cross points of the eye diagram decrease, as shown in FIG. 3C. The pulse width has to be enlarged to adjust the cross points to the center of the eye diagram, as shown in FIG. 3B. While the pulse width has to be shortened in a contrary condition.

Average Power Control (APC) or Digital Automatic Power Control (DAPC) means that when the environmental temperature varies, the laser driver circuit 102 controls the laser diode 106 to maintain the laser power at a stable level. The difference between APC and DAPC is that APC is suitable for continuous mode application and the DAPC is suitable for burst mode application. The invention uses a continuous mode laser driver circuit for a burst mode application. APC is therefore not suitable for the invention. DAPC is also not used in the invention. Instead, an external circuit is used. The Open loop status means that when the optical output power is not connected to the laser driver circuit 102 to establish a feedback system, the laser driver circuit 102 still works well.

For example, the integrated circuit Philips TZA 3050 has a pulse width adjustment input, a temperature compensation output, and is workable in an open loop. Therefore, it is suitable for the laser driver circuit 102 of the invention.

With reference to FIG. 1, a pulse width adjustment circuit is determined by the characteristics of the laser driver circuit and a test is performed. The pulse width adjustment circuit 104 receives the temperature compensation signal 108 to generate a pulse width adjustment signal 110.

The pulse width adjustment circuit 104 need to perform a over-compensation protection for the temperature compensation signal 108 to generate a over-compensated pulse width adjustment signal 110. A linear relation can be found in the voltage-versus-temperature characteristic of the temperature compensation signal 108. For example, a resistor combination is used as the pulse width adjustment circuit 104 to limit the voltage range of the temperature compensation signal, so that the voltage range of the temperature compensation signal can meet the requirement of pulse width adjustment (PWA). The over-compensation is avoided and the pulse width is properly adjusted to compensate the level shifting of the cross points caused by the environmental temperature. When the acceptable voltage range of the pulse width adjustment input is equal to the voltage range of the temperature compensation signal output, the pulse width adjustment circuit can even be a conducting wire and the temperature compensation signal output is directly connected to the pulse width adjustment input.

For example, if Vx represents the acceptable voltage range of the pulse width adjustment input, Va represents the voltage of the temperature compensation signal, and Vb represents the voltage drop across the pulse width adjustment circuit 104. Then Vx=Va−Vb. The pulse width adjustment circuit 104 is adjusted to limit the voltage that inputs to the pulse width adjustment input. The laser driver circuit 102 adjusts the pulse width 302 of the laser output eye diagram according to the pulse width adjustment signal 110 to achieve the goal of adjusting the cross point 304.

Figure 2A:
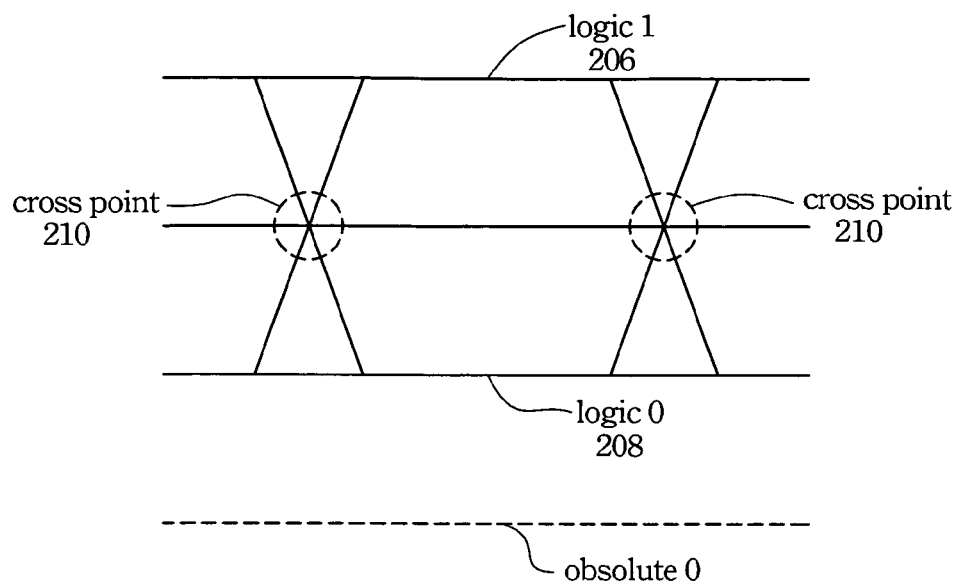
FIG. 2A is a diagram illustrating the optical eye diagram of the laser driver circuit used for a continuous mode application according to the present invention.
Figure 2B:
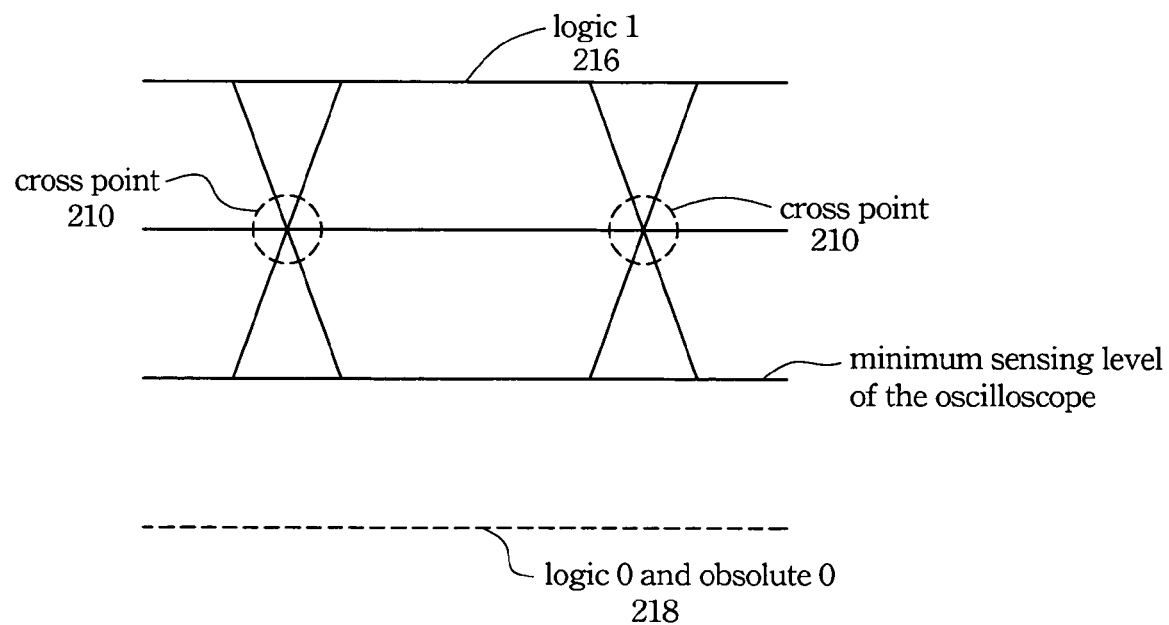
FIG. 2B is a diagram illustrating the optical eye diagram of the laser driver circuit used for a burst mode application according to the present invention.
Figure 4:
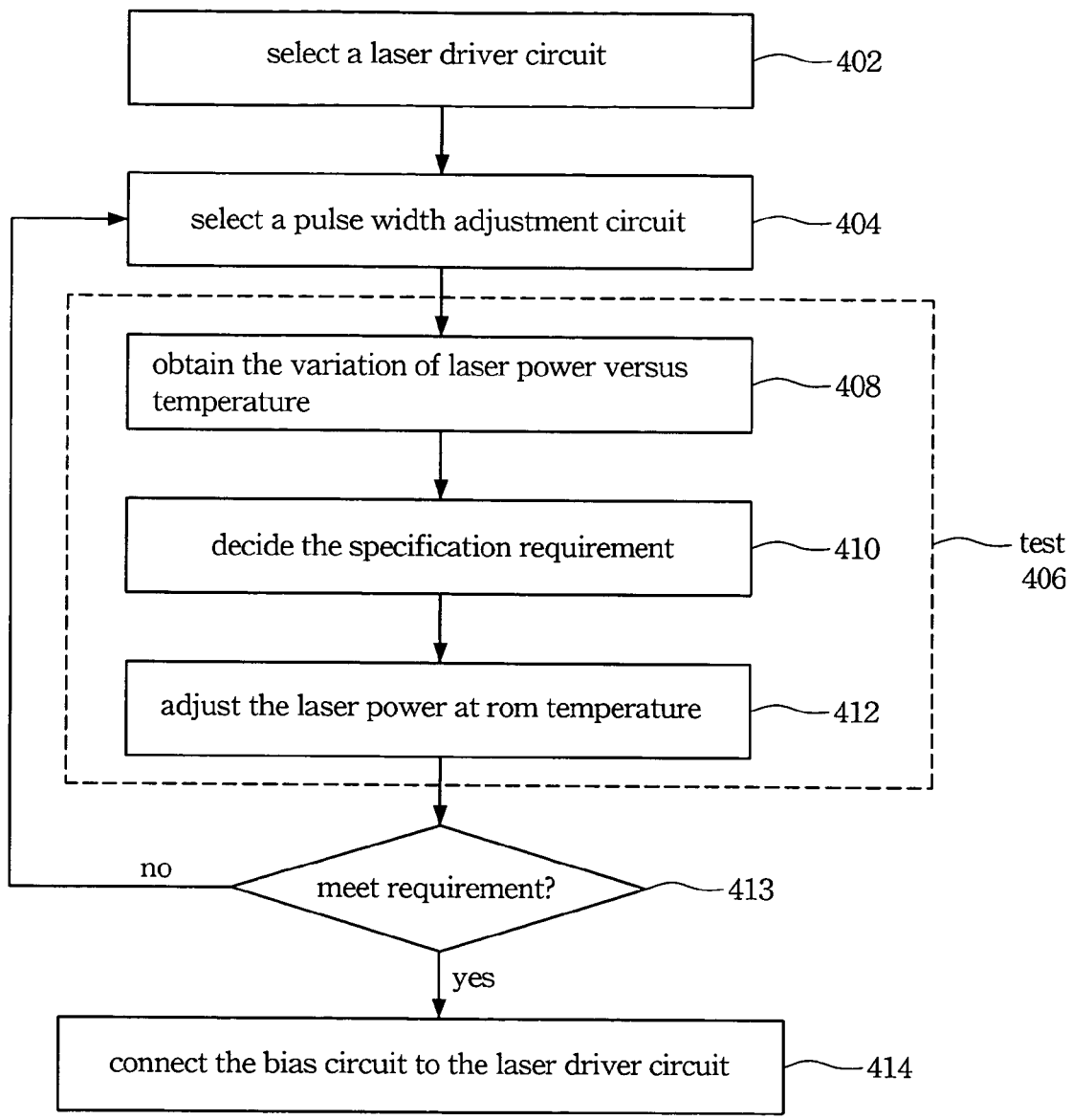
FIG. 4 is a diagram illustrating the flow chart of the method according to the present invention.

FIG. 2A is a diagram illustrating the optical eye diagram of the laser driver circuit used for a continuous mode application. FIG. 2B is a diagram illustrating the optical eye diagram of the laser driver circuit used for a burst mode application. With reference to FIG. 2A, the laser driver circuit uses the average power control mode, so that logic 1 level 206, logic 0 level 208, and the cross point 210 can be maintained at a stable level. With reference to FIG. 2B, the laser driver circuit doesn't use the average power control (APC) mode, so that logic 1 level 216, logic 0 level 218, and the cross point 210 cannot be maintained at a stable level and the level of the cross point 210 may shift to be too low or too high in FIG. 2B, the bias current is kept stable, so when the laser driver circuit is used in burst mode and the laser driver circuit is transmitting information, the bias current doesn't need to be turned on; while the laser driver circuit is used in burst mode and the laser driver circuit is not transmitting information, the bias current doesn't need to turn off. Therefore, no bias current settling time is needed in the laser emitting apparatus. The problem that the level of the cross point 210 is too high or too low, as shown in FIG. 2B, can be overcome by converting the temperature compensation signal 108 into the pulse width adjustment signal 110 through the pulse width adjustment circuit 104. The level of the cross point 210 is maintained at a predetermined level in a required temperature range of 0 to 70 degrees Celsius. A method for utilizing a continuous mode laser driver circuit for a burst mode application is also described. The method is used in the above embodiment. FIG. 4 is a diagram illustrating the flow chart of the method. With reference to FIG. 4 and FIG. 1, the method includes at least the following steps. First, a continuous mode laser driver chip is selected as the laser driver circuit 102 (step 402). The laser driver circuit 102 must have a temperature compensation signal output 116 and a pulse width adjustment input 118. The requirements for selecting the laser driver circuit 102 are the same as the requirements described in the above embodiment. For simplicity, the redundant description is omitted. The laser driver circuit 102 is used to drive the laser diode 106 to emit a laser light. Next, a pulse width adjustment circuit 104 is selected (step 404) and the pulse width adjustment circuit 104 is used to converting the temperature compensation signal 108 from the temperature compensation signal output 116 into a pulse width adjustment signal 110 that is input into the pulse width adjustment input 118.

Next, it's essential to obtain the variation of the laser output power versus temperature (step 408). Generally speaking, when the laser driver circuit 102 is used in an open loop status and when the temperature range is between 0 and 70 degrees Celsius, the average laser output power variation for logic 1 level and logic 0 level is about 3 dBm. So the average laser output power has to be adjusted according to the specification requirement.

Next, it's essential to decide the specification requirement (step 410). For example, in the temperature range of 0 to 70 degrees Celsius, if the predetermined specification requirement of the laser_output power is −1.5 dBm−+3.5 dBm, then the minimum value of the specification requirement of the laser output power is −1.5 dBm and the maximum value of the specification requirement of the laser output power is +3.5 dBm.

Next, adjust the laser output power at room temperature (step 412). The minimum value of the average laser output power at room temperature must be higher than the minimum value of the specification requirement of the laser output power. The difference between the minimum value of the average output power at room temperature and the minimum value of the specification requirement of the laser output power is a predetermined difference value. The predetermined difference value is the variation of the laser output power versus temperature. The average value of the variation of the laser output power versus temperature is 3 dBm.

In other words, the variation of the laser output power versus temperature, 3 dBm, is first decided, then the specification requirement of the average laser output power is determined by system to be in the range of −1.5 dBm−+3.5 dBm. Next, 3 dBm is added to −1.5 dBm and the result will be 1.5 dBm, which is the minimum setting value of the average laser output power at room temperature. The only thing that has to be confirmed is that the average laser output power at room temperature is higher than 1.5 dBm, so that the average laser output power doesn't vary out of the specification requirement as temperature varies.

Therefore, a first bias circuit 105 is used to achieve the laser output power mentioned above. The bias circuit 105 is a resistor combination. The bias circuit 105 is connected to the modulation current setting input 112 at one terminal and ground for the other. The modulation current can be adjusted by the resistor combination, so that the logic 1 level of the optical eye diagram is changed. Therefore, the laser output power of the laser driver circuit can be adjusted in the range of 1.5 dBm to 3.0 dBm at room temperature (25 degrees Celsius). The minimum laser output power is maintained at −1.5 dBm (1.5 dBm−3 dBm) even if the laser output power is reduced 3 dBm as temperature rise. The result can still meet the required specification of laser output power of the system.

Further, when the laser driver circuit 102 is turned to off state, the maximum value of the average laser output power at room temperature is smaller than a predetermined specification requirement of the laser output power. The difference between the average laser output power at room temperature and the specification requirement of the laser power is a predetermined difference value. The predetermined difference value is the variation of the laser output power due to temperature.

For example, when the laser driver circuit 102 is turned to off state, if the predetermined specification requirement of the laser output power is −43 dBm and the variation of laser output power due to temperature is 3 dBm, 3 dBm is subtracted from −43 dBm and the result is −46 dBm. −46 dBm will be the average laser output power setting at room temperature. Only one thing has to be confirmed, that is the average laser output power at room temperature is lower than −46 dBm.

Therefore, a second bias circuit 107 is used to achieve the laser output power requirement mentioned above. The second bias circuit 107 is also a resistor combination. The resistor combination is connected to the bias current setting input 114 at one end and is grounded for the other end. The bias current is adjusted through the resistor combination and then the logic 0 level of the optical eye diagram is adjusted. The laser output power is adjusted to −46 dBm to avoid the situation where the laser output power becomes higher than −43 dBm because of the variation of temperature.

If the test result meets the requirement, the pulse width adjustment circuit 104 is connected to the laser driver circuit 102. If the test result doesn't meet the requirement, the pulse width adjustment circuit 104 is replaced by another different pulse width adjustment circuit and a re-test is performed (step 413). Next, the pulse width adjustment circuit that meets the requirement is connected to the laser driver circuit (step 414). The connection relationship is shown in FIG. 1 and the redundant description is omitted for simplicity.

The "turn off" status mentioned above means that there is no input signal to the laser driver circuit 102. The room temperature is, for example, in the range of 20 degrees Celsius to 30 degrees Celsius. The preferred temperature is 25 degrees Celsius.

In summary, the temperature compensation signal 108 is converted to the pulse width adjustment signal 110 through the pulse width adjustment circuit 104, so that the cross points of the optical eye diagram of the laser emitting apparatus 100 is automatically adjusted in response to the temperature.

A cheap continuous mode laser driver circuit, such as an integrated circuit, is used in the laser emitting apparatus 100 and an external circuit is used to modify the laser driver apparatus 100 for a bust mode application. The laser emitting apparatus 100 after modification doesn't need a bias current settling time.

Although the present invention has been described in considerable detail with reference to certain preferred embodiments thereof, other embodiments are possible. Therefore, their spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for utilizing a continuous mode laser driver circuit for a burst mode application, comprising:

Selecting a continuous mode laser driver chip, wherein the chip has a temperature compensation output and a pulse width adjustment input, and the chip is used to drive a laser diode to generate a laser light;

converting the temperature compensation signal from the temperature compensation signal output of the chip into a pulse width adjustment signal by a pulse width adjustment circuit, wherein the pulse width adjustment signal is inputed into the pulse width adjustment input, and the pulse width adjustment signal automatically adjusts cross points of the optical eye diagram of the laser output according to environmental temperature, the cross points being maintained at a predetermined level and the bit error rate of system being reduced.

2. The method of claim 1, wherein the step of selecting the continuous mode laser driver chip further has the following requirements:

the laser driver chip is workable in an open loop mode;
the laser driver chip has a bias current setting function;
the laser driver chip has a modulation current setting function; and
the workable frequency, in continuous mode, of the laser driver chip is equal or higher than about 2.5 G Hz even if the laser driver chip is working under a frequency of about 1.5 G Hz in burst mode.

3. The method of claim 1, further comprising repeatedly replacing the pulse width adjustment circuit until the cross points are maintained at the predetermined level.

4. The method of claim 1, wherein the pulse width adjustment circuit is a resistor combination or a conducting wire, and wherein when the acceptable voltage range of the pulse width adjustment input is equal to the voltage range of the temperature compensation signal output, the pulse width adjustment circuit is omitted and the temperature compensation signal output is directly connected to the pulse width adjustment input, and when the acceptable voltage range of the pulse width adjustment input is smaller than the voltage range of the temperature compensation signal output, a resistor combination repeatedly selected is used to connect the temperature compensation output to the pulse width adjustment input until cross points are maintained at the predetermined level.

5. The method of claim 1, wherein variation of the output power of the laser diode versus temperature is about 3 dBm.

6. The method of claim 1, wherein when the temperature is between about 0 and 70 degrees Celsius, laser output power is limited to a range of about −1.5 dBm to 3.5 dBm.

7. The method of claim 1, further comprising:

Adjusting the average laser output power at room temperature, wherein when temperature is between about 0 and 70 degrees Celsius, laser output power is limited to a range of about −1.5 dBm to 3.5 dBm, the lowest laser output power is about −1.5 dBm, the logic level of the optical eye diagram has a variation of an average of about 3 dBm in response to the temperature, the modulation current setting input is grounded via a first bias circuit to avoid a situation where laser output power variation versus the temperature exceeds a limited range, so that the laser output power is set at least about 3 dBm higher than the lowest laser output power limit; and adjusting the average laser output power at room temperature when the laser driver chip is turned to off state, wherein when the laser driver chip is turned to off state, the laser output power is not higher than about 43 dBm, the logic level of the optical eye diagram has a variation of an average of about 3 dBm in response to the temperature, the bias current setting input is grounded via a second bias circuit to avoid a situation where the laser power variation versus the temperature exceeds a limited range, so that the second bias circuit adjusts the logic 0 level and the laser output power is adjusted to under about −46 dBm.

8. The method of claim 7, wherein the first bias circuit and the second bias circuit are respectively resistor combinations.

9. A laser emitting apparatus for a burst mode application, wherein the laser emitting apparatus comprises:

A laser driver circuit for providing a driving current to a laser diode for emitting a laser light, the laser driver circuit outputting a temperature compensation signal in response to environmental temperature, the laser driver circuit having a pulse width adjustment input for receiving a pulse width adjustment signal to adjust the pulse width; and a pulse width adjustment circuit connected to the laser driver circuit, the pulse width adjustment circuit receiving the temperature compensation signal to generate the pulse width adjustment signal;

wherein the pulse width is the pulse width of the optical eye diagram of the laser output, the laser driver circuit adjusts cross points of the optical eye diagram by adjusting the pulse width, so that the cross points are maintained at a predetermined level.

10. The laser emitting apparatus of claim 9, wherein the laser driver circuit is a continuous mode laser driver chip, the laser driver chip is workable in an open loop mode, the laser driver chip has a temperature compensation output, the laser driver chip has a pulse width adjustment function, the laser driver chip has a bias current setting function, the laser driver chip has a modulation current setting function, and the workable frequency of the laser driver chip, in continuous mode, is equal or higher than about 2.5 G Hz even if the laser driver chip is working under a frequency of about 1.5 G Hz in burst mode.

11. The laser emitting apparatus of claim 9, wherein when the temperature is between 0 and 70 degrees Celsius, the laser output power is limited to a range of about −1.5 dBm to 3.5 dBm.

12. The laser emitting apparatus of claim 9, wherein when the acceptable voltage range of the pulse width adjustment input is equal to the voltage range of the temperature compensation signal output, the pulse width adjustment circuit is a conducting wire and the temperature compensation signal output is directly connected to the pulse width adjustment input via the conducting wire.

13. The laser emitting apparatus of claim 9, wherein when the acceptable voltage range of the pulse width adjustment input is lower than the voltage range of the temperature compensation signal output, the pulse adjustment circuit is a resistor combination, and the temperature compensation signal output is connected to the pulse width adjustment input via the resistor combination, so that the cross points of the optical eye diagram of the laser output are maintained at a predetermined level.

14. The laser emitting apparatus of claim 9, wherein the maximum variation of the average laser output power within a temperature range is about 3 dBm and the temperature range is between about 0 and 70 degrees Celsius.

15. The laser emitting apparatus of claim 9, further comprising a first bias circuit, the first bias circuit being connected to the modulation current setting input of the laser driver circuit at one terminal and grounded for the other terminal, wherein the first bias circuit is used to adjust the minimum value of the average laser output power at room temperature, the minimum value of the average laser output power at room temperature is higher than the minimum value of the specification requirement of the laser output power, the difference between the minimum value of the average laser output power at room temperature and the minimum value of the specification requirement of the laser output power is a predetermined difference value, the average laser output power at room temperature is the average laser output power of the laser diode at room temperature, and the value of the specification requirement of the laser output power is a predetermined specification requirement of the laser output power.

16. The laser emitting apparatus of claim 15, wherein the first bias circuit is a resistor combination.

17. The laser emitting apparatus of claim 15, wherein the predetermined difference value is about 3 dBm.

18. The laser emitting apparatus of claim 9, wherein the laser emitting apparatus further comprises a second bias circuit, the second bias circuit is connected to the bias current setting input of the laser driver circuit at one terminal and grounded for the other, the second bias circuit is used to adjust the maximum value of the average laser output power at room temperature, when the laser driver circuit is turned to off state, the value of the average laser output power at room temperature is less than a predetermined specification requirement of the laser output power, and the difference between the value of the average laser output power at room temperature and the predetermined specification requirement of the laser output power is a predetermined difference.

19. The laser emitting apparatus of claim 18, wherein the second bias circuit is a resistor combination.

20. The laser emitting apparatus of claim 18, wherein the minimum value of the predetermined difference is about 3 dBm.

* * * * *